US009670580B2

(12) United States Patent
Eickelkamp et al.

(10) Patent No.: US 9,670,580 B2
(45) Date of Patent: Jun. 6, 2017

(54) MOCVD LAYER GROWTH METHOD WITH SUBSEQUENT MULTI-STAGE CLEANING STEP

(71) Applicant: AIXTRON SE, Herzogenrath (DE)

(72) Inventors: Martin Eickelkamp, Würselen (DE); Thomas Krücken, Aachen (DE)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 14/785,310

(22) PCT Filed: Apr. 17, 2014

(86) PCT No.: PCT/EP2014/057891
§ 371 (c)(1),
(2) Date: Oct. 16, 2015

(87) PCT Pub. No.: WO2014/173806
PCT Pub. Date: Oct. 30, 2014

(65) Prior Publication Data
US 2016/0076145 A1    Mar. 17, 2016

(30) Foreign Application Priority Data
Apr. 23, 2013    (DE) .................. 10 2013 104 105

(51) Int. Cl.
C23C 16/44       (2006.01)
C23C 16/30       (2006.01)
B08B 9/00        (2006.01)

(52) U.S. Cl.
CPC ........ C23C 16/4405 (2013.01); C23C 16/303 (2013.01); B08B 9/00 (2013.01)

(58) Field of Classification Search
None
See application file for complete search history.

(56) References Cited

U.S. PATENT DOCUMENTS

2003/0045098 A1    3/2003  Verhaverbeke et al.
2007/0148557 A1*   6/2007  Takei ............... C23C 18/02
                                                    430/4
(Continued)

FOREIGN PATENT DOCUMENTS

DE    102004009130 A1    9/2005
DE    102007009145 A1    8/2008
(Continued)

OTHER PUBLICATIONS

International Search Report and Written Opinion, from the European Patent Office, mailed Aug. 19, 2014, for International Patent Application No. PCT/EP2014/057891 (filed Apr. 17, 2014), 11 pgs.
International Search Report (English Translation) dated Oct. 30, 2014, from the European Patent Office, for International Patent Application No. PCT/EP2014/057891 (filed Apr. 17, 2014), 2 pages.
(Continued)

Primary Examiner — Joseph Miller, Jr.
(74) Attorney, Agent, or Firm — Ascenda Law Group, PC

(57) ABSTRACT

In a method for depositing layers on one or more substrates arranged in a process chamber, at least one carbon-containing gaseous source material is used in at least one deposition step. During layer growth on the one or more substrates, parasitic coatings are also deposited on the wall surfaces of the process chamber. After removing the one or more substrates from the process chamber, a gas flow containing one or more cleaning gases is introduced into the process chamber and the process chamber is heated to a cleaning temperature. The parasitic coatings are transformed into volatile substances, which are removed from the process chamber with the gas flow. To remove a carbon-containing residue on the wall surfaces, an ammonia cleaning step is performed in which the carbon-containing residue reacts with ammonia to form a volatile compound which is removed from the process chamber with the gas flow.

11 Claims, 2 Drawing Sheets

(56) References Cited

U.S. PATENT DOCUMENTS

| | | | |
|---|---|---|---|
| 2009/0090384 A1* | 4/2009 | You | C23C 16/4405 134/1.1 |
| 2010/0273290 A1* | 10/2010 | Kryliouk | C23C 16/303 438/99 |
| 2010/0273291 A1 | 10/2010 | Kryliouk et al. | |
| 2011/0117728 A1* | 5/2011 | Su | C23C 16/4404 438/478 |
| 2013/0005118 A1 | 1/2013 | Jun et al. | |

FOREIGN PATENT DOCUMENTS

| | | |
|---|---|---|
| DE | 102011054566 A1 | 4/2013 |
| DE | 102012102661 A1 | 10/2013 |
| WO | 2010/129183 A2 | 11/2010 |
| WO | 2010/129289 A2 | 11/2010 |

OTHER PUBLICATIONS

Written Opinion (English Translation) dated Oct. 23, 2015, from the European Patent Office, for International Patent Application No. PCT/EP2014/057891 (filed Apr. 17, 2014), 5 pages.

International Preliminary Report issued Oct. 27, 2015, from the European Patent Office, for International Patent Application No. PCT/EP2014/057891 (filed Apr. 17, 2014), 5 pages.

International Preliminary Report (English Translation) issued Oct. 27, 2015, from the European Patent Office, for International Patent Application No. PCT/EP2014/057891 (filed Apr. 17, 2014), 5 pages.

* cited by examiner

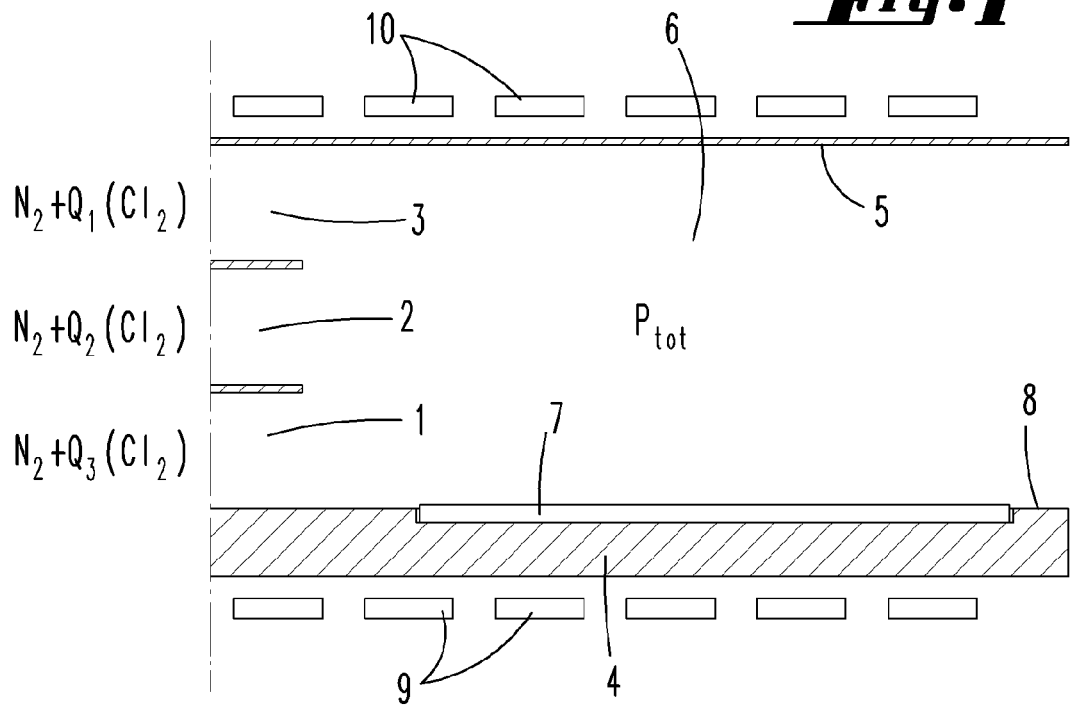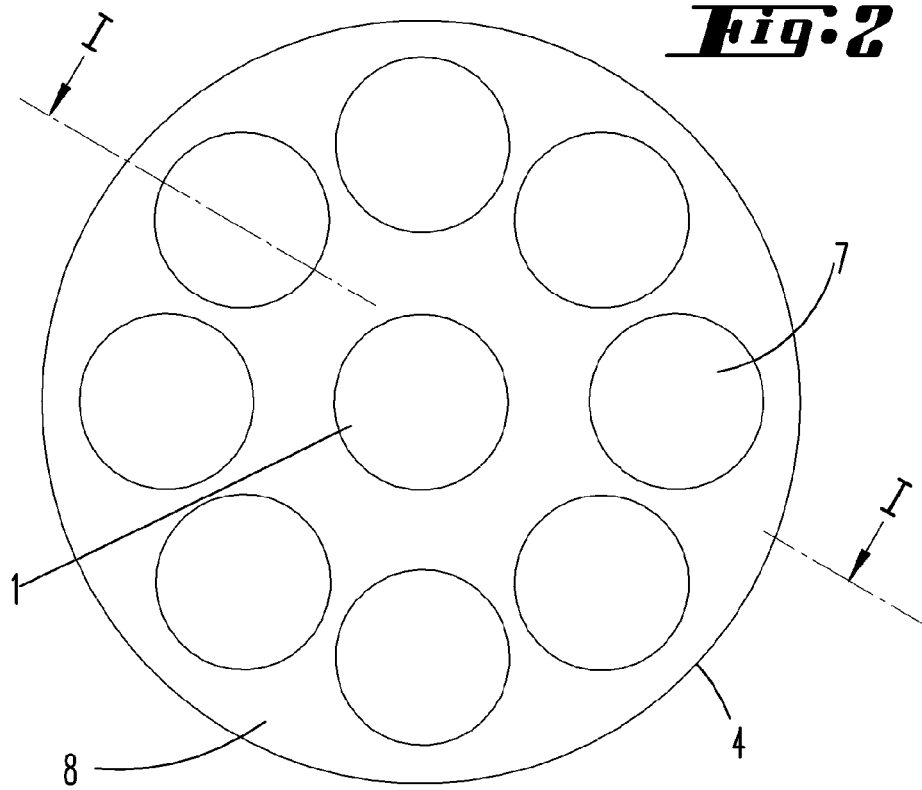

MOCVD LAYER GROWTH METHOD WITH SUBSEQUENT MULTI-STAGE CLEANING STEP

RELATED APPLICATIONS

This application is a National Stage under 35 USC 371 of and claims priority to International Application PCT/EP2014/057891 filed 17 Apr. 2014, which claims priority to DE Application 10 2013 104 105.1 filed 23 Apr. 2013, which is incorporated herein by reference.

FIELD OF THE INVENTION

The invention relates to a method for depositing layers, in particular of elements of the III and V, the II and VI or of the IV main group on one or a plurality of substrates arranged in a process chamber of a CVD reactor, wherein at least one carbon-containing gaseous source material is used in at least one deposition step, wherein at least one carbon-containing gaseous source material is used in at least one deposition step, wherein parasitic coatings are also deposited on the wall surfaces of the process chamber during the layer growth on the one or plurality of substrates, wherein, after removal of the one or plurality of substrates from the process chamber, the parasitic coatings react in a cleaning process, as a result of the introduction of a gas flow containing one or a plurality of cleaning gases and heating of the process chamber to a cleaning temperature, into volatile substances, which are transported out of the process chamber with the gas flow.

BACKGROUND

A method for depositing III, IV semiconductor layers in the MOCVD method is described in DE 102007009145 A1, for example. This document describes a MOCVD reactor comprising a process chamber, which has a susceptor, in the case of which a plurality of substrates is arranged around a symmetry center in a substantially rotationally symmetrical arrangement. A gas inlet body, through which process gases are introduced into the process chamber through a plurality of gas inlet zones, which are arranged on top of one another, is located in the symmetry center. Process gasses, which differ from one another, flow into the process chamber through gas inlet zones of the gas inlet body in response to the growth process. The process gases are organometallic compounds, which contain an element from the III main group, and hydrides, for example $NH_3$. The process gasses flow from the radially inner gas inlet body to a gas outlet ring, which surrounds the process chamber and through which the process gas leaves the process chamber again.

DE 102012102661 describes a method, by means of which the coatings, which are not only deposited on the substrates in response to the layer growth, but which are also deposited on the walls of the process chamber, can be removed again. An etching gas, for example $Cl_2$, is introduced into the process chamber for this purpose. Parasitic coatings on the walls of the susceptor, on the process chamber ceiling and other process chamber walls are removed by means of this etching gas. The etching gas is introduced into the process chamber together with $N_2$. This takes place through the gas inlet zones of the gas inlet body, through which the corresponding process gases are introduced into the process chamber in response to the layer growth. To clean different zones of the process chamber in consecutive partial steps, the cleaning gases are introduced into the process chamber at different locations under hydrodynamic conditions, which differ from one another. The cleaning steps, which differ from one another, are carried out in response to total gas pressures, which differ from one another, or in response to average flow speeds, respectively. The partial gas pressures of the cleaning gas, thus in particular $Cl_2$, can vary as well. By introducing $Cl_2$, GaN but also elemental Ga can be removed from the walls of the process chamber.

During the layer growth, the growth conditions are often set in such a manner that the deposited semiconductor layers do not only contain GaN, but also C as dopant. In any event, C is contained in the organometallic compounds, which form a gaseous source material. For example, trimethyl gallium disintegrates into gallium and a methyl residue, wherein the methyl residue can also disintegrate again. The carbon created thereby or the hydrocarbon-containing compounds created thereby, respectively, can adhere to the surface of the process chamber walls.

It is observed that a soot-like film remains on the walls of the process chamber after the cleaning step, as his described in DE 102007009145 A1.

US 2003/0045098 A1 describes the cleaning of surfaces of substrates with the help of etching gases. $O_2$, $N_2$, $H_2O$, $NH_3$, $CF_4$, $C_2F_6$, $CHF_3$, $C_3H_2F_6$, $C_2H_4F_2$ or $CH_3F$ are proposed as etching gases. A photoresist mask is to also be capable of being removed by means of these etching gases. Nitrogen-containing and oxygen-containing gases are to be introduced into the process chamber simultaneously in this document.

WO 2010/129183 proposes the use of ammonia as cleaning gas at temperatures of above 1,000° C., so as to remove $GaCl_3$ from a process chamber.

US 2013/0005118 A1 describes a CVD process, in the case of which $N_2/H_2$ or $NH_3$ as well as HCl are added to gaseous source materials, which contain elements of the III main group.

It is known from WO 2010/129289 to heat up a process chamber in the presence of ammonia, so as to remove $GaCl_3$ deposited on the process chamber walls.

SUMMARY OF THE INVENTION

The invention is based on the object of specifying measures, by means of which the soot-like residues, which remain after a generic breakdown step, are removed from the process chamber.

The object is solved by means of the invention specified in the claims. According to the invention, the cleaning process comprises a plurality of steps. Parasitic coatings are broken down into volatile constituents of a first volatile compound in a breakdown step. A carbon-containing residue is created thereby on the wall surfaces. These wall surfaces are removed in an ammonia process step, which follows the breakdown step. For this purpose, ammonia is introduced into the process chamber. This ammonia reacts with the carbon-containing residue to form a second volatile compound, which is transported out of the process chamber with the gas flow. While a halogen-containing etching gas is used in the breakdown step in the absence of $NH_3$, ammonia is used in the ammonia cleaning step, namely preferably in the absence of oxygen-containing or halogen-containing gases. Absence of oxygen-containing and/or halogen-containing gases means that such substances are present in the gas phase in a concentration of <1 ppm. The carbon-containing residues can contain elemental carbon or hydrocarbon compounds. In a preferred embodiment of the invention, only ammonia in a combination with an inert gas, thus for example $H_2$, $N_2$ or a noble gas, are used in the ammonia cleaning step. Preferably, a gas mixture, in which no $H_2$ or less than 0.1% of $H_2$, respectively, is present in the gas mixture, is used in response to the ammonia cleaning step. The ammonia cleaning process preferably takes place at susceptor temperatures in the range of between 1,000 and 1,300° C. The process chamber ceiling arranged above the susceptor can have a temperature, which is lower by approximately 200°, if it is not heated actively. The total gas pressure within the process chamber is thereby less than 100 mbar. On principle, it is sufficient when the ammonia cleaning step is carried out for a period of between 5 and 10 minutes. More than 50% of the volume gas flow, which is introduced into the process chamber, can be $NH_3$ during the ammonia cleaning step. The ammonia cleaning step can be carried out in a plurality of consecutive partial steps. Ammonia and the associated gas, for example $N_2$ or $H_2$, are introduced into the process chamber through the gas inlet body, through which the growth process gases are introduced into the process chamber in response to the growth process. The gas inlet body preferably has a plurality of gas inlet zones, which are arranged vertically on top of one another, and is located in the center of a substantially rotationally symmetrical MOCVD reactor. The floor of the process chamber forms the susceptor, on which the substrates, which are to be coated, are arranged around the gas inlet body in a ring-shaped arrangement. In response to the growth process, the susceptor is heated from the below. It is also possible to heat the process chamber ceiling, which extends parallel in horizontal direction to the susceptor, from the top. Generally, however, it is sufficient when only the susceptor, thus the process chamber floor is heated. The indirect heating of the process chamber ceiling attained through this is sufficient for the ammonia cleaning process. The process gases introduced into the process chamber, for example TMGa and $NH_3$, disintegrate pyrolytically on the substrate surface during the growth process, so that gallium nitride is formed, which grows on the substrates in crystalline form. Not only growth takes place on the surface of the substrates during the crystal growth. Parasitic coatings, which contain Ga and N, are also formed on the surfaces of the susceptor, which are not coated with the substrates, and on the process chamber ceiling. These coatings can also contain carbon or hydrocarbon-containing compounds, respectively. The process chamber needs to be cleaned after one or a plurality of process steps, by means of which one or a plurality of layers, which differ from one another, are deposited on the substrates. This takes place in the absence of the substrates. In the case of a preferred cleaning process, only hydrogen is initially introduced into the process chamber at increased temperatures so as to break down the III/V crystalline depositions in advance. This takes place in response to total pressures of between 50 and 900 mbar. Preferably, this high-temperature hydrogen-bake step takes place at the total pressure of 100 mbar and at temperatures, which lie between 1,000 and 1,300° C. This advance breakdown step lasts approximately 10 to 60 minutes. During the advance breakdown step, the GaN, which is contained in the parasitic coatings, disintegrates to Ga and volatile $NH_3$ according to the reaction $2GaN+3H_2 \rightarrow 2Ga+2NH_3$.

Gallium oxyles, which might be contained in the parasitic coating, can also convert chemically into elemental gallium during the advance breakdown step according to the reaction $Ga_2O_3+3H_2 \rightarrow 2Ga+3H_2O$.

So as to be differentiated with regard to the other cleaning steps, a second cleaning step, which follows this advance breakdown step, is identified as a breakdown step herein. This second cleaning step is carried out according to the method, as is described in DE 102012102661. Group III components are removed in this $Cl_2$ bake step. A mixture of $Cl_2$ and $N_2$ is introduced into the process chamber at a total pressure of <900 mbar, preferably approximately 100 mbar. The chlorine portion is between 1 and 20% by volume. The susceptor temperature lies in the range of between 800° C. and 900° C. The process is carried out for approximately 10 to 60 minutes. During this breakdown process, gallium disintegrates into volatile gallium chloride according to $2Ga+3Cl_2 \rightarrow 2GaCl_3$.

In the case of this disintegration step, gallium nitride also reacts into volatile gallium chloride according to $2GaN+3Cl_2 \rightarrow 2GaCl_3+N_2$.

Even though the largest portion of the parasitic coatings is removed from the walls of the process chamber during the above-described breakdown step, a soot-like, in particular carbon-containing residue oftentimes remains on the walls of the process chamber. This carbon-containing residue is removed in the ammonia cleaning step according to the invention. In the case of this cleaning step, substantially ammonia is introduced into the process chamber. This takes place at a temperature, which lies between 1,000 and 1,300° C. The ammonia cleaning step is carried out at total gas pressures of <100 mbar. Carbon is thereby converted into volatile HCN by means of ammonia, for instance according to the following reaction $C+NH_3 \rightarrow HCN+H_2$.

To support this reaction, the ammonia is introduced without associated hydrogen, at least in a partial step. Due to the following competitive reactions $2NH_3 \rightarrow N_2+3H_2$ $2NH_3+xyz\ Cl_6 \rightarrow N_2+6HCl+xyz$ ammonia is preferably introduced into the process chambers with nitrogen so as to avoid the ammonia breaking down into nitrogen. The feeding of ammonia preferably also takes place in the absence of HCl, water or oxygen for the same reasons. xyz $Cl_6$ identifies halogens or halogen-containing compounds, which were not removed completely from the reactor in an advance partial step (ammonia/water).

The flushing steps, which are known per se, in the case of which the process chamber is freed from residual gases by repeatedly flooding the process chamber with an inert gas, for example hydrogen or nitrogen or a noble gas by being pumped out, is carried out after the ammonia cleaning step. It is also possible to carry out a plurality of ammonia cleaning steps in succession, wherein the process chamber is cleaned by flushing and pumping out between the individual ammonia cleaning steps. The feeding of ammonia can take place through gas inlet zones, which differ from one another. Locations of the process chamber, which differ from one another, can then be treated specifically in individual, consecutive steps. In a preferred alternative of the method, sequences of different cleaning steps are carried out repeatedly in succession. An individual sequence can be repeated twice, three times or several times, for example. The efficiency is higher than if individual steps were lengthened correspondingly. The sequences contain a heating step, in response to which only hydrogen is introduced into the process chamber, a cleaning step, in response to which chlorine is introduced into the process chamber as cleaning gas, and a cleaning step, in response to which ammonia is introduced into the process chamber, wherein the ammonia cleaning step can consist of cleaning steps, which differ from one another. For example, ammonia together with hydrogen can be introduced into the process chamber in a first partial step, ammonia together with nitrogen in a second partial step and ammonia together with hydrogen in a third partial step.

BRIEF DESCRIPTION OF THE DRAWINGS

The invention will be explained in detail below by means of enclosed drawings.

FIG. 1 shows a cross section through a process chamber, as indicated by the line I-I in FIG. 2, wherein $Cl_2$ and $N_2$ is introduced into the process chamber, FIG. 2 shows a top view onto a susceptor comprising a plurality of substrates 7, which are arranged around the center in a ring-shaped manner.

DETAILED DESCRIPTION

Figure 3:
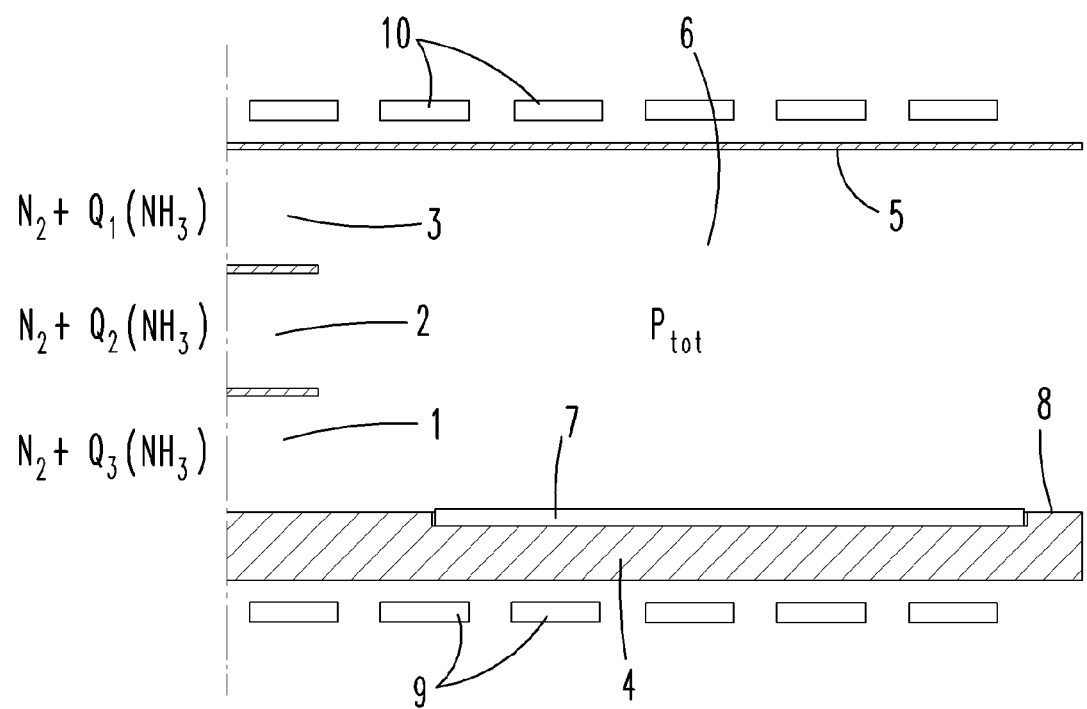
FIG. 3 shows an illustration according to FIG. 1, wherein not chlorine, but ammonia is introduced into the process chamber through the gas inlet zones 1, 2, 3.

The method according to the invention is carried out in a process chamber 6 of a reactor housing, which is closed in a gas-tight manner to the outside. The process chamber 6 has a process chamber floor 8, which is formed by the susceptor 4. The susceptor has a circular disk-shape and a center, above which a gas inlet body comprising three gas inlet zones 1, 2, 3, which are arranged vertically on top of one another, is located. Process gas is fed into the gas inlet zones 1, 2, 3 from the top. However, the feeding of the process gases can also take place from the bottom.

A heater, by means of which the susceptor 4 can be heated to a coating temperature or cleaning temperature, respectively, is located below the susceptor 4. The diameter of the susceptor 4 can be between 50 cm and 1 m.

A process chamber ceiling 5 is located above the susceptor 4. A further heater 10, by means of which the process chamber ceiling 5 is heated, is located above the process chamber ceiling 5. In a non-illustrated exemplary embodiment, which corresponds to a preferred embodiment, the heater 10 is not present, because the heating of the process chamber ceiling 5 is not required on principle in the case of the MOCVD process, which is carried out in the process chamber 6. The heater 10 can only be used for carrying out cleaning steps.

Substrates 7, which are arranged around the gas inlet body in a ring-shaped manner, are coated in the process chamber 6. For this purpose, trimethyl gallium and ammonia are introduced into the process chamber in a hydrogen atmosphere through the gas inlet zones 1, 2, 3 of the gas inlet body. Instead of trimethyl gallium or ammonia, other nitrides or other organometallic compounds, respectively, can also be used, depending on which crystals are to be deposited on the substrates. A doping can be carried out by means of carbon, whereby the carbon of the methyl groups of the organometallic compounds is also used for this purpose.

Coating processes are described in DE 102004009130 or also in DE 102011054566 A1.

To remove the parasitic coatings deposited on the surface sections of the susceptor 4, which are not covered by the substrates 7 in response to the coating, a cleaning process is carried out after removing the substrates 7 from the process chamber 6. In response to this cleaning process, the process chamber floor 8 and the process chamber ceiling 5 are heated to a cleaning temperature with the help of the heaters 9 and 10. The level of the cleaning temperature is a function of the cleaning step. In MOCVD reactors, in the case of which the heater 10 is missing, the process chamber ceiling heats up by means of thermal radiation from the heater 9 or from the susceptor 4, which is heated by means of the heater 9, respectively. The temperatures specified below correspond to the substrate temperatures. The process chamber ceiling temperatures are lower by approximately 200° in this case.

Substantially only hydrogen is introduced into the process chamber in a first cleaning step, which is carried out at a high cleaning temperature, which lies in the range of between 1,000 and 1,300° C. In the case of a total pressure, which can lie between 50 and 900 mbar, which preferably lies at approximately 100 mbar, 10 to 100 slm of $H_2$ are introduced into the process chamber for approximately 10 to 60 minutes. GaN, which is deposited on the process chamber walls, thereby converts into $NH_3$. Surface oxide layers ($Ga_2O_3$), which might be present, can be reduced.

The group III components are removed from the surfaces in particular with a variable etching front in a second cleaning step, which is identified herein with breakdown step or etching step. This step, which is substantially not dependent on pressure, takes place at low pressures, that is, at total gas pressures of <100 mbar. The breakdown step is carried out for 10 to 60 minutes at susceptor temperatures of between 800 and 900° C. $Cl_2$ and $N_2$ are introduced into the process chamber during this time, wherein up to 20% or more of this gas mixture is formed by $Cl_2$. In response to this breakdown step, gallium but also gallium nitride is broken down into volatile gallium chloride. Carbon-containing solids can also form here or can remain on the surface of the process chamber walls as residues, respectively.

To remove these carbon-containing residues from the wall surfaces, in particular from the floor 8 of the process chamber and the ceiling 5 of the process chamber, ammonia ($NH_3$) together with oxygen is introduced into the process chamber through the gas inlet zones 1, 2, 3. The partial flows identified in FIG. 3 with $Q_1$ ($NH_3$), $Q_2$ ($NH_3$), $Q_3$ ($NH_3$) can vary, that is, ammonia cleaning steps, which differ from one another, can be carried out in succession, whereby different flows of ammonia are introduced into the process chamber 6 through the individual gas inlet zones 1, 2, 3, which are located vertically on top of one another, so as to clean different zones of the process chamber in succession.

The ammonia cleaning step or steps are carried out at total pressures of less than 100 mbar. In particular, 10 slm of $NH_3$ together with 150 slm of $H_2$, $N_2$ or a noble gas flow into the process chamber. However, provision is also made for more $NH_3$ than $N_2$, for example, to be introduced into the process chamber. A flow of 60 slm of $NH_3$ together with a flow of 15 slm of $N_2$ can be introduced into the process chamber, for example in an alternative process. The ammonia cleaning step is preferably carried out for a period of less than 15 minutes. The temperatures preferably lie between 1,000 and 1,300° C. In response to the process, carbon and $NH_3$ converts into HCN and $H_2$. Preferably, the ammonia cleaning step takes place without the presence of halogens or even hydrogen. The avoidance of hydrogen favors the desired reaction to HCN and $H_2$ and the present of nitrogen suppresses competitive breakdown reactions of the $NH_3$ in $N_2$ and $H_2$ or to $N_2$ and HCl, respectively, if chlorine-containing residues of preceding etching steps are contained in the process chamber.

To remove all reactive gases from the process chamber, a plurality of pumping-flushing-cycles are carried out subsequently, wherein the process chamber is alternately flooded with an inert gas, for example nitrogen or hydrogen or a noble gas and is pumped out to pressures of less than 50 mbar. Typical flushing flows lie at around 150 slm. During the pumping phase, the flushing flows are also reduced to below 100 slm. A pumping-flushing cycle lasts approximately 5 minutes.

Provision is also made to separate a plurality of ammonia cleaning cycles by means of a pumping-flushing step in each case. It can also be sensible to repeat the entire cleaning sequence, because cleaning steps, which target one type of coatings, are hindered by a different type of coating, which is attacked by a different cleaning step.

The total process thus runs approximately as follows:
1. Heating the process chamber in a hydrogen atmosphere, so as to pre-break the metal-nitrogen compounds.
2. Optionally: heating the process chamber ceiling to a higher temperature at the beginning of the $Cl_2$ heating step.
3. One or a plurality of $Cl_2$ heating steps, which follow in succession, under different flow conditions, so as to clean spatially different areas of the process chamber (inner areas, outer areas, upper areas, lower areas).
4. Heating in a $H_2/NH_3$ atmosphere at approximately 1290° C. (susceptor temperature).
5. Heating in a $N_2/NH_3$ atmosphere at a temperature of approximately 1200° C. (susceptor temperature) so as to remove carbon residues.
6. Heating in a $H_2/NH_3$ atmosphere at approximately 1290° C. (susceptor temperature).

The step sequence including steps 1 to 6 can be repeated several times in succession.

The above statements serve to explain the inventions, which are captured as a whole by the application and which further develop the prior art independently in each case at least by the following feature combinations, namely:

A method, which is characterized in that the cleaning process comprises a breakdown step, in which the parasitic coatings are broken down into volatile constituents and a carbon-containing residue remains on the wall surfaces (5, 8), which, in an ammonia cleaning step, reacts with ammonia, which is introduced into the process chamber, to a volatile compound, which is transported out of the process chamber with the gas flow.

A method, which is characterized in that a halogen-containing etching gas is used in the breakdown step in the absence of $NH_3$.

A method, which is characterized in that the ammonia cleaning step is carried out in the absence of oxygen-containing and/or halogen-containing gases.

A method, which is characterized in that the carbon-containing residues contain hydrocarbons and/or elemental carbon.

A method, which is characterized in that only $NH_3$ and $H_2$ or $NH_3$ and $N_2$ or $NH_3$ and a noble gas are introduced into the process chamber 6 in the ammonia cleaning process.

A method, which is characterized in that the ammonia cleaning step is carried out at temperature of between 1,000 and 1,300° C.

A method, which is characterized in that the ammonia cleaning step is carried out at a total gas pressure in the process chamber 6 of less than 100 mbar and/or that the ammonia cleaning step is carried out for a period of between 5 and 10 minutes.

A method, which is characterized in that, in the ammonia cleaning step, more than 50% of the volume gas flow, which is introduced into the process chamber 6, is $NH_3$ and/or that gas mass flows $Q_n$, ($NH_3$), which differ from one another, are introduced into the process chamber 6 in a plurality of consecutive partial steps at locations (1, 2, 3), which differ from one another.

A method, which is characterized in that the breakdown step is carried out in a plurality of partial steps, wherein gas mass flows $Q_n$, ($Cl_2$), which differ from one another in each case, are introduced into the process chamber 6 at locations 1, 2, 3, which differ from one another, and/or that the breakdown step is carried out at a process temperature of between 800 and 900° C. and/or that the breakdown step is carried out at a total gas pressure in the process chamber 6 of less than 100 mbar and/or that up to 10% by volume of a halogen, in particular $Cl_2$ as cleaning gas together with $N_2$ is introduced into the process chamber 6 during the breakdown step and/or that the breakdown step is carried out for a period of between 10 and 60 minutes.

A method, which is characterized by an advance breakdown step, which precedes the breakdown step, in which substantially only $H_2$ is introduced into the process chamber 6 at temperature of between 1,000 and 1,300° C. and/or that the total gas pressure in the process chamber 6 is between 50 and 900 mbar and/or that the advance breakdown step is carried out for a period of between 10 and 60 minutes during the advance breakdown step.

A method, which is characterized by a flushing step, which follows the ammonia cleaning step, during which the process chamber is flushed cyclically with an inert gas, in particular $H_2$ or $N_2$ and is pumped out to pressures of below 50 mbar for removing all reactive gases.

A method, which is characterized in that a sequence of a plurality of consecutive cleaning steps, consisting at least of one breakdown step and an ammonia cleaning step, is carried out repeatedly in succession.

All of the disclosed features (alone but also in combination with one another) are significant for the invention. The disclosure content of the corresponding/enclosed priority documents (copy of the parent application) is herewith included in its entirety in the disclosure of the application, also for the purpose of adding features from these documents into claims of the instant application. With their features, the subclaims characterize inventive further developments of the prior art, in particular for the purpose of filing divisional applications on the basis of these claims.

What is claimed is:

1. A method for depositing layers on one or a plurality of substrates (7) arranged in a process chamber (6) of a chemical vapor deposition (CVD) reactor, wherein at least one carbon-containing gaseous source material is used in at least one deposition step, wherein parasitic coatings are also deposited on the wall surfaces (5, 8) of the process chamber (6) during the layer growth on the one or plurality of substrates, wherein, after removal of the one or plurality of substrates (7) from the process chamber, the parasitic coatings react in a cleaning process, as a result of an introduction of a gas flow containing one or a plurality of cleaning gases and heating of the process chamber (6) to a cleaning temperature, into volatile substances, which are transported out of the process chamber (6) with the gas flow, characterized in that the cleaning process comprises (i) a first breakdown step as an initial step of the cleaning process, (ii) a second breakdown step that follows the first breakdown step, the parasitic coatings being broken down during the first and second breakdown steps into volatile constituents and a carbon-containing residue which remains on the wall surfaces (5, 8), and (iii) an ammonia cleaning step following the second breakdown step, wherein in the first breakdown step, $H_2$ is introduced into the process chamber (6) at a first temperature, wherein in the second breakdown step, $Cl_2$ and $N_2$ are introduced into the process chamber (6) at a second temperature that is lower than the first temperature, wherein in the ammonia cleaning step, the carbon-containing residue reacts with ammonia, which is introduced into the process chamber (6), to form a volatile compound, which is transported out of the process chamber (6) with the gas flow, and wherein in the ammonia cleaning step, only $NH_3$ and $H_2$ only $NH_3$ and $N_2$, or only $NH_3$ and a noble gas are introduced into the process chamber at a third temperature that is higher than the second temperature.

2. A method according to claim 1, further characterized in that the second breakdown step occurs in the absence of NH3.

3. A method according to claim 1, further characterized in that the ammonia cleaning step is carried out in the absence of oxygen-containing and/or halogen-containing gases.

4. The method according to claim 1, further characterized in that the carbon-containing residue contains hydrocarbons and/or elemental carbon.

5. The method according to claim 1, further characterized in that the third temperature is between 1,000 and 1,300° C.

6. The method according to claim 1, further characterized in that
  (i) the ammonia cleaning step is carried out at a total gas pressure in the process chamber (6) of less than 100 mbar and/or
  (ii) the ammonia cleaning step is carried out for a period of between 5 and 10 minutes.

7. The method according to claim 1, further characterized in that,
  (i) in the ammonia cleaning step, more than 50% of the volume gas flow, which is introduced into the process chamber (6), is $NH_3$ and/or
  (ii) gas mass flows, $Q_1(NH_3)$, $Q_2(NH_3)$ and $Q_3(NH_3)$, which differ from one another, are introduced into the process chamber (6) in a plurality of consecutive partial steps at locations (1, 2, 3), which differ from one another.

8. The method according to claim 1, further characterized in that
  (i) the second breakdown step is carried out in a plurality of partial steps, wherein gas mass flows $Q_1(Cl_2)$, $Q_2(Cl_2)$ and $Q_3(Cl_2)$, which differ from one another, are introduced into the process chamber (6) at locations (1, 2, 3), which differ from one another, and/or
  (ii) the second breakdown step is carried out at a process temperature of between 800 and 900° C. and/or
  (iii) the second breakdown step is carried out at a total gas pressure in the process chamber (6) of less than 100 mbar and/or
  (iv) up to 10% by volume of $Cl_2$ as cleaning gas together with $N_2$ is introduced into the process chamber (6) during the second breakdown step and/or
  (v) the second breakdown step is carried out for a period of between 10 and 60 minutes.

9. The method according to claim 1, wherein in the first breakdown step
  (i) substantially only $H_2$ is introduced into the process chamber (6) at temperature of between 1,000 and 1,300° C. and/or
  (ii) a total gas pressure in the process chamber (6) is between 50 and 900 mbar and/or
  (iii) the first breakdown step is carried out for a period of between 10 and 60 minutes.

10. The method according to claim 1, further comprising a flushing step, which follows the ammonia cleaning step, during which the process chamber is flushed cyclically with an inert gas and is pumped out to pressures of below 50 mbar for removing all reactive gases.

11. The method according claim 1, characterized in that the first breakdown step, the second breakdown step and the ammonia cleaning step are carried out repeatedly in succession.

\* \* \* \* \*